United States Patent [19]
Matsuura et al.

[11] Patent Number: 6,001,413
[45] Date of Patent: Dec. 14, 1999

[54] METHOD FOR PRODUCING ORGANIC ELECTROLUMINESCENT DEVICE

[75] Inventors: Masahide Matsuura, Tokyo; Hiroshi Tokailin; Chishio Hosokawa, both of Sodegaura, all of Japan

[73] Assignee: Idemitsu Kosan Co., Ltd., Tokyo, Japan

[21] Appl. No.: 09/036,000

[22] Filed: Mar. 6, 1998

[30] Foreign Application Priority Data

Mar. 10, 1997 [JP] Japan .................................. 9-054679

[51] Int. Cl.$^6$ ....................................................... B05D 5/06
[52] U.S. Cl. .......................... 427/64; 427/162; 427/255.6; 427/299; 427/294; 427/419.5
[58] Field of Search ........................... 427/64, 299, 419.5, 427/294, 255.6, 162

[56] References Cited

PUBLICATIONS

Patent Abstracts of Japan, vol. 098, No. 013, Nov. 30,1998, JP 10 214682, Aug. 11, 1998.
Patent Abstracts of Japan, vol. 098, No. 001, Jan. 30, 1998, JP 09 232075, Sep. 5, 1997.
Derwent Abstracts, AN 95–324087, JP 07 220873, Aug. 18, 1995.

*Primary Examiner*—Janyce Bell
*Attorney, Agent, or Firm*—Oblon, Spivak, McClelland, Maier & Neustadt, P.C.

[57] ABSTRACT

Disclosed is a method for producing organic EL devices stably having intended capabilities. The method comprises cleaning an electrode-mounted substrate 17 followed by forming a plurality of film layers including organic layers and a counter electrode layer, on the electrode mounted on the substrate, successively one after another in vacuum, wherein the time just after the finish of cleaning the electrode-mounted substrate 17 and before the start of forming the first film layer on the electrode 12 is shorter than the time within which the value of the contact angle with water of the surface of the electrode 12 just after the finish of cleaning it increases by 30° in vacuum. In producing organic EL devices having a plurality, n=1, 2, 3, . . . , of film layers on an electrode-mounted substrate, the time just after the finish of forming the n'th film layer and before the start of forming the next (n+1)'th film layer is shorter than the time within which the value of the contact angle with water of the surface of the n'th film layer just after having been formed increases by 30° in vacuum. In the organic EL devices produced, the interfaces between the adjacent layers are protected from being contaminated with impurities.

6 Claims, 2 Drawing Sheets

METHOD FOR PRODUCING ORGANIC ELECTROLUMINESCENT DEVICE

FIELD OF THE INVENTION

The present invention relates to a method for producing organic electroluminescent (EL) devices.

BACKGROUND OF THE INVENTION

As being self-luminescent, EL devices have high visibility. In addition, as being completely solid, EL devices have higher impact resistance than liquid crystal devices. Therefore, the use of EL devices in various displays as light emitters is being widely noticed. EL devices are grouped into inorganic EL devices and organic EL devices, the former containing inorganic compounds in their light-emitting layers while the latter containing organic compounds. For organic EL devices containing organic compounds in their light-emitting layers, various structures of various materials have heretofore been proposed capable of giving high luminance at low voltage of direct currents.

Vacuum vapor deposition is one typical method of producing organic EL devices, which comprises vaporizing predetermined organic compounds under heat to form films on substrates. However, conventional organic EL devices, even though having good initial capabilities, are often problematic in that their capabilities are greatly reduced within a short period of time. It has heretofore been difficult to produce organic EL devices all the time stably having the designed capabilities. It is known that contamination of substrates causes the reduction in the capabilities of EL devices. In particular, in organic EL devices, contamination of the electrode/organic layer interface and the organic layer/organic layer interface is one factor of interfering with the carrier injection from the substrate electrode into the organic layers, thereby having noticeable negative influences on the capabilities of the devices.

In order to prevent the reduction in the capabilities of EL devices by such contamination, disclosed is a method of cleaning the surface of an electrode-mounted substrate to make it have a contact angle with water of smaller than 25°, prior to forming organic layers on the substrate (see Japanese Patent Application Laid-Open (JP-A) No. 220873/1995). In this method, the cleaned substrate is stored in vacuum or in inert gas to prevent it from being contaminated.

Also disclosed is a method of continuously producing organic EL devices all the time in vacuum, in which is used a vacuum chamber having therein a plurality of vacuum processing rooms, and each one of plural layers is formed in each room successively one after another (see JP-A No. 111285/1996). These vacuum rooms each have therein a source material to be vaporized for forming the intended film. A substrate is disposed in a predetermined one of those rooms, then the gate valve is shut, and thereafter the deposition source in the room is heated to form a film on the substrate through vapor deposition from the source.

However, organic EL devices as produced according to the method disclosed in JP-A No. 220873/1995 could not still have stable capabilities.

The method disclosed in JP-A No. 111285/1996, in which the deposition source is heated after the substrate has been disposed in the vacuum chamber, is problematic in that impurities having vaporized in the initial stage of heating deposit on the substrate to thereby worsen the capabilities of the devices produced. This is because the deposition sources, such as organic compounds for constituting organic layers and metals for constituting electrodes, are exposed in air prior to being set on the holders, and therefore impurities in air, such as organic substances, carbon dioxide, water, oxygen and the like adhere onto them. In particular, since synthetic organic compounds are formed in solvent, the solvent used often remains in the compounds. As a result, the deposition source of such a synthetic organic compound shall contain the solvent as an impurity. The impurity vaporizes in the initial stage of heating, thereby causing contamination of the substrate and the film formed thereon.

SUMMARY OF THE INVENTION

The object of the present invention is to provide a method for producing organic EL devices that stably have the intended capabilities.

In order to solve the problems mentioned above, we, the present inventors noted the contaminated condition of substrates in vacuum, and investigated the time-dependent change in the contaminated condition of each substrate on the basis of a parameter, contact angle with water of the substrate. Concretely, substrates were stored in vacuum, and the contact angle with water of each substrate was measured at predetermined time intervals. As a result, we have found that the contact angle with water of each substrate increases with the lapse of time even in vacuum, and have obtained the finding that substrates are, even though stored in vacuum, contaminated by impurities existing in the vacuum chamber. These our findings indicate that the reason for the failure to stabilize the capabilities of the devices in the method (disclosed in JP-A No. 220873/1995) is because the cleaned substrates are stored in vacuum and the thin films formed on the substrates are exposed in vacuum for a long period of time during the film-forming process.

In the method of present invention, the next film is formed before the substrate and the previously-formed film are contaminated in vacuum to thereby stably ensure the intended capabilities of the devices produced.

Concretely, the method of the invention for producing organic EL devices comprises cleaning an electrode-mounted substrate followed by forming a plurality of film layers including organic layers and a counter electrode layer, on the electrode mounted on the substrate, successively one after another in vacuum, in which the time just after the finish of cleaning the electrode-mounted substrate and before the start of forming the first film layer on the electrode is shorter than the time within which the value of the contact angle with water of the surface of the electrode just after the finish of cleaning it increases by 30° in vacuum.

Figure 1:
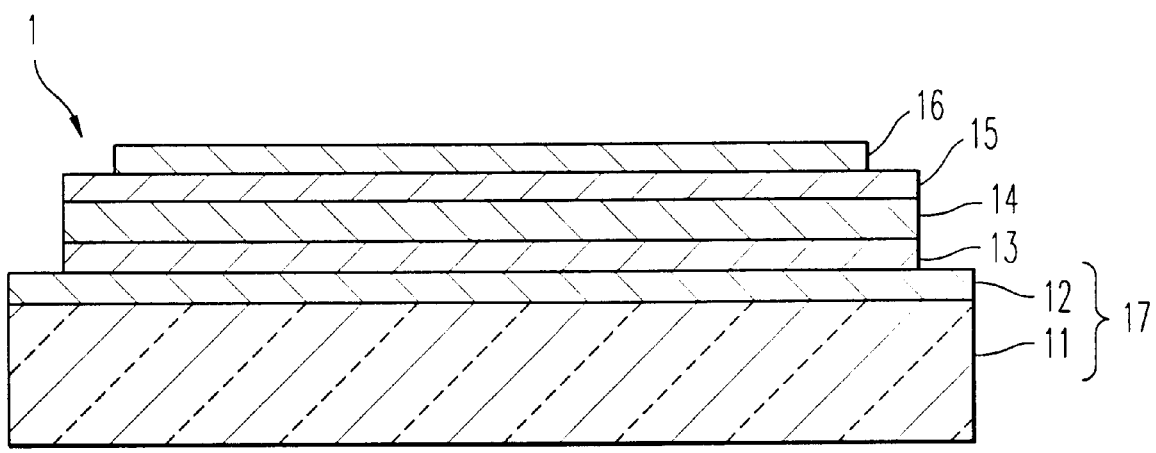
FIG. 1 is a cross-sectional view showing one embodiment of the organic EL device produced according to the method of the invention.

In those drawings, 1 is an organic EL device; 2 is a production apparatus for producing the organic EL device; 11 is a substrate; 12 is a transparent electrode; 13 is a hole injection layer (first organic layer); 14 is a light-emitting layer (second organic layer); 15 is an electron injection layer (third organic layer); 16 is a counter electrode (fourth layer); 17 is an electrode-mounted substrate; 21 is a cleaning room (vacuum chamber); 22 is a first film-forming room (vacuum chamber); 23 is a second film-forming room (vacuum chamber); 24 is a third film-forming room (vacuum chamber); 25 is a fourth film-forming room (vacuum chamber); and 41, 42, 43 and 44 are deposition sources.

DETAILED DESCRIPTION OF THE INVENTION

For the method of the invention for producing organic EL devices, the time within which the value of the contact angle with water of the surface of the electrode just after the finish of cleaning it increases by 30° in vacuum is previously determined. On the basis of the time thus determined, the first film layer is formed on the electrode in accordance with the method of the invention.

In the method of the invention, the first layer is formed on the electrode previously formed on the substrate just after having cleaned the electrode-mounted substrate and within the defined period of time within which the contact angle with water of the surface of the electrode increases by 30°, whereby the adhesion of impurities on the electrode-mounted substrate is surely prevented. Specifically, in the method of the invention, cleaning the electrode-mounted substrate reduces the contact angle with water of the surface of the electrode to be lower than 30° or less than the initial value of the non-cleaned one, and the first layer is formed on the electrode before the contact angle with water of the surface of the electrode increases to be larger by 30° or more than the initial value of the electrode just after cleaned. In that manner, therefore, the first layer is formed on the electrode that is cleaner than the non-cleaned one, resulting in that the interface between the electrode and the first layer formed thereon is surely protected from being contaminated. Accordingly, in the method of the invention, adhesion of impurities on the surface of the devices produced is surely reduced, and the devices produced shall stably have the intended capabilities.

Just after having cleaned the surface of the electrode and before forming the first layer on the electrode, the increase in the contact angle with water of the surface of the electrode is preferably not larger than 20°, more preferably not larger than 10°. In the preferred condition in which the first layer is formed before the increase in the contact angle with water of the surface of the electrode is not larger than 20°, the uniformity of the light-emitting surface of the device produced is improved; and in the more preferred condition in which the increase in question is not larger than 10°, not only the uniformity of the light-emitting surface is more improved but also the overall light-emitting capabilities of the device produced are improved. In those conditions, the life of the devices produced is prolonged.

The method of the invention for producing organic EL devices, comprising forming a plurality, n=1, 2, 3, . . . , of film layers including organic layers and a counter electrode layer, on an electrode mounted on a substrate, successively one after another in vacuum, is characterized in that the time just after the finish of forming the n'th film layer and before the start of forming the next (n+1)'th film layer is shorter than the time within which the value of the contact angle with water of the surface of the n'th film layer just after having been formed increases by 30° in vacuum.

In this method of the invention for producing organic EL devices, the time within which the contact angle with water of the surface of the n'th layer just after having been formed increases by 30° in vacuum is previously determined. On the basis of the time thus determined, the next (n+1)'th layer is formed on the previously-formed n'th layer.

In the method of the invention, the (n+1)'th layer is formed on the previously-formed n'th layer while the n'th layer is clean just after having been formed and within the defined period of time within which the contact angle with water of the surface of the n'th layer increases by 30°, whereby the penetration of impurities into the interface between the n'th layer and the (n+1)'th layer is prevented. In that manner, therefore, the devices produced shall stably have the intended capabilities.

Just after having formed the n'th layer and before forming the next (n+1)'th layer on the n'th layer, the increase in the contact angle with water of the surface of the n'th layer is preferably not larger than 20°, more preferably not larger than 10°. In the preferred condition in which the (n+1)'th layer is formed before the increase in the contact angle with water of the surface of the n'th layer is not larger than 20°, the uniformity of the light-emitting surface of the device produced is improved; and in the more preferred condition in which the increase in question is not larger than 10°, not only the uniformity of the light-emitting surface is more improved but also the overall light-emitting capabilities of the device produced are improved. In those conditions, the life of the devices produced is prolonged.

The plural film layers may be formed in any film-forming methods including sputtering methods. It is desirable that these films are formed through vapor deposition for which the deposition source for the (n+1)'th layer is previously heated prior to the finish of forming the previous n'th layer.

Pre-heating the deposition source for the (n+1)'th layer removes the impurities that may vaporize in the initial stage of heating the deposition source for the (n+1)'th layer, prior to the deposition of the (n+1)'th layer on the previously-formed n'th layer, resulting in that the (n+1)'th layer formed is protected from being contaminated with such impurities. In that manner, the devices produced shall have good capabilities.

In addition, by the pre-heating, the vaporizing condition of the deposition source for the (n+1)'th layer can be stabilized within a short period of time just after the finish of forming the n'th layer so that the time after the finish of forming the n'th layer and before the start of forming the next (n+1)'th layer can be surely shortened. In other words, forming the (n+1)'th layer can surely be started before the contact angle with water of the surface of the previously-formed n'th layer increases in vacuum to be larger by 30° than the initial value of the n'th layer just after having been formed. As a result, the contamination of the surface of the n'th layer, or that is, the contamination of the interface between the n'th layer and the overlying (n+1)'th layer is surely reduced, and the devices produced shall stably have the intended capabilities.

Preferably, the pre-heating of the deposition source for the (n+1)'th layer is so attained before the finish of the formation of the previous n'th layer that the deposition rate, R, of the vaporizing material to give the (n+1)'th layer on the substrate satisfies, while being based on a predetermined deposition rate, r, to form the (n+1)'th layer on the substrate, the requirements of $0.7r \leq R \leq 1.3\ r$ and $R \geq 10$ Å/sec.

The predetermined deposition rate, r, to form the (n+1)'th layer on the substrate as referred to herein is derived from the tactical time for the deposition step to give the (n+1)'th layer, which may be calculated from the amount of the devices produced and from the process of producing the devices, while depending on the type of the deposition material used for the (n+1)'th layer.

Controlling the deposition rate, R, of the vaporizing material to give the (n+1)'th layer on the substrate within the defined range before the finish of the formation of the previous n'th layer is effective in stabilizing the actual deposition rate, R, of the (n+1)'th layer on the substrate to be nearer to the predetermined deposition rate, r, within a shortest period of time. Accordingly, immediately after the finish of deposition the previous n'th layer, the deposition of the next (n+1)'th layer can be started, and, in addition, the contamination of the interface between the n'th layer and the (n+1)'th layer formed thereon is greatly reduced. As a result, the tactical time for continuous production of devices can be shortened.

The plural film layers noted above can be formed in one and the same vacuum chamber, but are preferably formed in different vacuum chambers in such a manner that the vacuum chamber where the (n+1)'th layer is formed is previously degassed prior to the finish of the formation of the previous n'th layer.

Pre-degassing the vacuum chamber for the (n+1)'th layer reduces the pressure in the vacuum chamber for the (n+1)'th layer to a predetermined one within a short period of time after the finish of the formation of the n'th layer, thereby surely shortening the time after the finish of the formation of the n'th layer and before the start of the formation of the (n+1)'th layer. In other words, this ensures the start of forming the (n+1)'th layer before the contact angle with water of the surface of the n'th layer increases in vacuum to be larger by 30° than the initial value of the n'th layer just after having been formed. As a result, the contamination of the surface of the n'th layer, or that is, the contamination of the interface between the n'th layer and the overlying (n+1)'th layer is surely reduced, and the devices produced shall stably have the intended capabilities.

Preferably, the pre-degassing of the vacuum chamber for the (n+1)'th layer is so attained before the finish of the formation of the previous n'th layer that the pressure, P, in the vacuum chamber for the (n+1)'th layer satisfies, while being based on a predetermined pressure, p, in the vacuum chamber in which the (n+1)'th layer is to be formed, the requirement of $0.1 \leq P \leq 10p$.

Controlling the pressure, P, in the vacuum chamber for the (n+1)'th layer within the defined range before the finish of the formation of the previous n'th layer is effective in stabilizing the actual pressure, P, in the vacuum chamber in which the (n+1)'th layer is to be formed to be nearer to the predetermined pressure, p, within a shortest period of time. Accordingly, immediately after the finish of deposition the previous n'th layer, the deposition of the next (n+1)'th layer can be started, and, in addition, the contamination of the interface between the n'th layer and the (n+1)'th layer formed thereon is greatly reduced. As a result, the tactical time for continuous production of devices can be surely shortened.

Where the pre-degassing of the vacuum chamber for the (n+1)'th layer is combined with the pre-heating of the deposition source for the (n+1)'th layer, it is desirable that the pre-degassing is attained to satisfy the above-mentioned requirement in a predetermined period of time after the start of pre-heating the deposition source. This is because, in the initial stage of heating the deposition source for the (n+1)'th layer in the vacuum chamber, impurities are released from the source, resulting in increasing the pressure of the vacuum chamber and even making it unstable, whilst the release of the impurities from the source is terminated after the heating is continued for a while whereby the pressure in the vacuum chamber is lowered and then stabilized. Namely, the release of impurities from the source under heat takes some time before the pressure in the vacuum chamber is stabilized.

Now, one embodiment of the present invention is described hereinunder, with reference to the drawings attached hereto.

FIG. 1 shows an organic EL device 1 produced according to one embodiment of the invention. The device 1 illustrated comprises a substrate 11, a transparent electrode (anode) 12 of an ITO film formed on the substrate 11, a hole injection layer 13 which is the first layer of an organic film formed on the transparent electrode 12, a light-emitting layer 14 which is the second layer of an organic film formed on the hole injection layer 13, an electron injection layer 15 which is the third layer of an organic film formed on the light-emitting layer 14, and a counter electrode (cathode) 16 which is the fourth layer formed on the electron injection layer 15.

Figure 2:
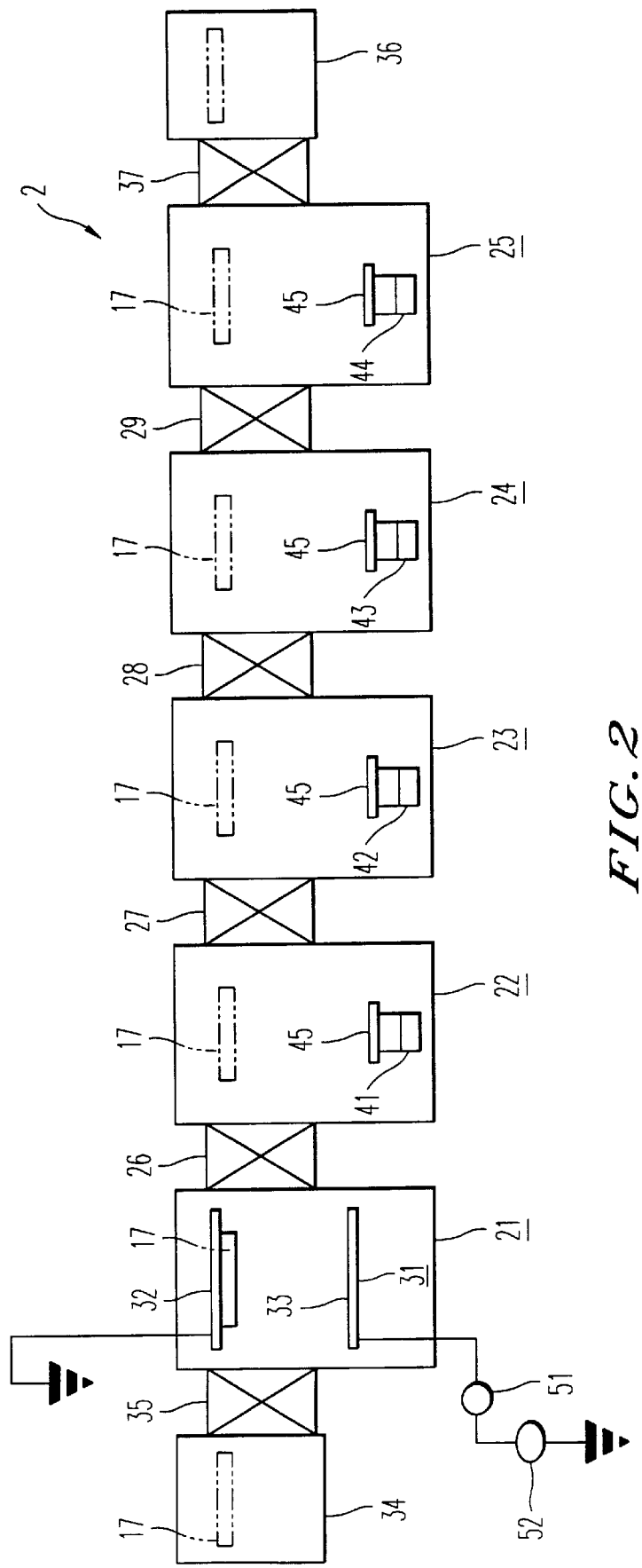
FIG. 2 is a schematic view showing a production apparatus used in producing the organic EL device illustrated in FIG. 1.

The organic EL device 1 is produced, using a production apparatus 2 illustrated in FIG. 2. In the production apparatus 2 for producing the organic EL device 1 illustrated, the electrode-mounted substrate 17 having the transparent electrode 12 on the surface of the substrate 11 (see FIG. 1) is cleaned, and a plurality of films are formed thereon as illustrated. The apparatus 2 illustrated does not include a means of forming anodes. This apparatus 2 comprises a dry cleaning room 21 and four film-forming rooms, first, second, third and fourth rooms 22, 23, 24 and 25 all connecting in series. These rooms 21 to 25 are all vacuum chambers each equipped with a vacuum degassing system (not shown), and connect in series by valves 26, 27, 28 and 29.

The dry cleaning room 21 is a room in which the electrode-mounted substrate 17 is cleaned, and is equipped with a RF plasma cleaner (direct plasma type) wherein 31 is a lower electrode (anode 33) and 32 is an upper electrode. The RF plasma power is supplied via a matching unit 51 from a RF power supply 52. Rare gas such as argon or the like and oxygen are introduced into the cleaning room 21 to form plasma therein, whereby the electrode-mounted substrate 17 is cleaned in the room 21.

Regarding its plasma-generating system, the plasma cleaner 31 is not limited to only that of a double-pole discharging type. Employable herein are any other plasma cleaners of different types, including, RIE (reactive ion etching) type.

A load locking room 34 equipped with a vacuum degassing system (not shown) is disposed adjacent to the dry cleaning room 21, and the dry cleaning room 21 connects with the load locking room 34 via a valve 35. The electrode-mounted substrate 17 is transported into the dry cleaning room 21 through the load locking room 34, without opening the dry cleaning room 21 to be exposed to the open air.

The first film-forming room 22 that is adjacent to the dry cleaning room 21 via the valve 26 therebetween is a room in which a hole injection layer 13 is deposited on the transparent electrode 12. This room 22 is provided with a deposition source holder 41, which contains therein a vaporizing material and is heated to give a vapor for the hole injection layer 13. This deposition source holder 41 is of a resistance heating system, in which a vaporizing material for the hole injection layer 13 is put in a crucible and is heated to give a vapor. This is provided with an openable shutter 45. By shutting the shutter 45, the vapor of the vaporizing material is prevented from adhering onto the substrate 17.

The second film-forming room 23 that is adjacent to the first film-forming room 22 via the valve 27 therebetween is a room in which a light-emitting layer 14 is formed on the hole injection layer 13. This room 23 is provided with a deposition source holder 42, a vaporizing material and is heated to give a vapor for the light-emitting layer 14.

The third film-forming room 24 that is adjacent to the second film-forming room 23 via the valve 28 therebetween is a room in which an electron injection layer 15 is formed on the light-emitting layer 14. This room 24 is provided with a deposition source holder 43, which is heated to give a vapor for the electron injection layer 15.

The fourth film-forming room 25 that is adjacent to the third film-forming room 24 via the valve 29 therebetween is a room in which a counter electrode 16 is formed on the electron injection layer 15. This room 25 is provided with a deposition source holder 44, which is heated to give a vapor of metal for the counter electrode 16.

Adjacent to the fourth film-forming room 25, disposed is a load locking room 36, like the load locking room 34 noted above. The load locking room 36 connects with the fourth film-forming room 25 via a valve 37. The electrode-mounted substrate 17 is, after having been processed as above, taken out of the fourth film-forming chamber 25 through the load locking chamber 36, without opening the chamber 25 to be exposed to the open air.

The deposition source holders 42 to 44 in the second to fourth film-forming rooms 23 to 25 are of the same type as that of the deposition source holder 41 in the first film-forming room noted above, and each is provided with a shutter 45.

In the rooms 21 to 25, 34 and 36 in the production apparatus 2, disposed are transportation lines (not shown), through which the electrode-mounted substrate 17 being processed is transported into the chambers 21 to 25 and 36 in order without opening those chambers 21 to 25, 34 and 36 to be exposed to the open air. The transportation lines may be of any type of belt conveyers or tray conveyers, or may also be of a robot-type one equipped with arms by which the electrode-mounted substrate 17 is held and transported.

In the apparatus 2 for producing organic EL devices, the electrode-mounted substrate 17 to be processed is, after having been ultrasonically cleaned in an organic solvent, transported into the dry cleaning room 21 through the load locking room 34, cleaned by plasma in this room 21, then transported to the first to fourth film-forming rooms 22 to 25 in that order to form the hole injection layer 13, the light-emitting layer 14, the electron injection layer 15 and the counter electrode 16 in those rooms 22 to 25, respectively, and finally taken out through the load locking room 36. In that manner, the production apparatus 22 of this embodiment of the present invention is so constructed that the organic EL device 1 can be continuously produced therein all the time in vacuum.

In the rooms 21 to 25, 34 and 36, the electrode-mounted substrate 17 being processed is all the time so set that the transparent electrode 12 faces downward in FIG. 2.

Now, using the production apparatus 2 illustrated, one example of producing the organic EL device 1 is mentioned below.

First, for the transparent electrode 12, the hole injection layer 13, the light-emitting layer 14 and the electron injection layer 15, the relationship between the time for which the surface of each of the films 12 to 15 is exposed in vacuum and the time-dependent increase in the contact angle with water of each surface is determined by experiment.

Concretely, for the transparent electrode 12, the electrode-mounted substrate 17 is, after having been ultrasonically cleaned in an organic solvent, cleaned with plasma in the dry cleaning room 21, and then left in vacuum. Having been left in vacuum for a predetermined period of time after the finish of the plasma cleaning, the transparent electrode 12 is tested to measure the contact angle with water of its surface. This measurement is repeated several times at predetermined time intervals, and the relationship between the storing time in vacuum and the contact angle with water of the surface of the transparent electrode 12 thus stored in vacuum is obtained from the data measured. From this, obtained is the storing time, T1, after which the contact angle with water of the surface of the thus-stored transparent electrode 12 increased to be larger by 10° than the initial value of the surface thereof just after cleaned. In this experiment, the substrate 17 is stored all the time under the same pressure as that under which the hole injection layer 13 is to be formed.

For the hole injection layer 13, this is deposited on the transparent electrode 12, which was previously formed on the electrode-mounted substrate 17, in the first film-forming room 22, and then left in vacuum. Having been left in vacuum for a predetermined period of time after the finish of the deposition of the hole injection layer 13, the layer 13 is tested to measure the contact angle with water of its surface. This measurement is repeated several times at predetermined time intervals, and the relationship between the storing time in vacuum and the contact angle with water of the surface of the hole injection layer 13 thus stored in vacuum is obtained from the data measured. From this, obtained is the storing time, T2, after which the contact angle with water of the surface of the thus-stored layer 13 increased to be larger by 10° than the initial value of the surface thereof just after formed. In this experiment, the substrate 17 is stored all the time under nearly the same pressure as that under which the next light-emitting layer 14 is to be formed on the hole injection layer 13.

For the light-emitting layer 14 and the electron injection layer 15, obtained are the storing times, T3 and T4, after which the contact angle with water of each of the surfaces of the stored layers 14 and 15 increased to be larger by 10° than the initial value of each surface of those layers just after formed, in the same manner as above for the hole injection layer 13.

Next, on the basis of the thus-obtained times, T1 to T4, the electrode-mounted substrate 17 is cleaned and the layers 13 to 16 are formed thereon.

Concretely, the dry cleaning room 21 is previously degassed to have a predetermined reduced pressure, and the electrode-mounted substrate 17 having been ultrasonically cleaned in an organic solvent is put into the load locking room 32.

Next, the load locking room 34 is degassed to have a reduced pressure that is a little lower than that in the cleaning room 21, and then the valve 35 is opened, through which the electrode-mounted substrate 17 is transported into cleaning room 21. In this manner, the impurities existing in the load locking room 34 are prevented from flowing into the cleaning room 21 during the transportation of the substrate 17 from the room 34 to the room 21.

In this cleaning room 21, the electrode-mounted substrate 17 is cleaned with plasma by means of the plasma cleaner 31.

Ultrasonically cleaning the electrode-mounted substrate 17 followed by cleaning it with plasma reduces the contact angle with water of the surface of the transparent electrode 12 to be smaller by 30° or more than that thereof before cleaned.

On the other hand, while the electrode-mounted substrate 17 is cleaned with plasma, or that is, before the cleaning of the substrate 17 with plasma is finished, heating the deposition source in the holder 41 in the first film-forming room 22 is begun while degassing the room 22.

Pre-heating the deposition source 41 is started with the shutter 45 being shut, and is effected on the basis of a predetermined deposition rate, r1, of the hole injection layer 13 to be formed on the substrate 17. Concretely, before the finish of cleaning the electrode-mounted substrate 17 in the cleaning room 21, the deposition source 41 is so pre-heated that the deposition rate, R1, to form the layer 13 on the substrate 17 satisfies the requirements, $0.7r1 \leq R1 \leq 1.3r1$ and $R1 \geq 10$ Å/sec.

The predetermined deposition rate, r1, of the hole injection layer 13 to be formed on the substrate 17 is derived from the tactical time for the deposition step to give the layer 13, which may be calculated from the amount of the organic EL device 1 to be produced and from the process of producing the device 1, while depending on the type of the deposition material used for the layer 13.

Pre-degassing the first film-forming room 22 is effected on the basis of a predetermined pressure, p1, in the room 22 under which the hole injection layer 13 is to be formed therein. Concretely, before the finish of cleaning the substrate 17 in the cleaning room 21, the first film-forming room 22 is so degassed that the reduced pressure, P1, in the thus-degassed room 22 satisfies the requirement, $0.1p1 \leq P1 \leq 10p1$. The reduced pressure, P1, in the room 22 shall fall within the range of $1.33'10^{-1}$ Pa $\leq P1 \leq 1.33 \times 10^{-5}$ Pa.

This pre-degassing is effected in parallel with the pre-heating of the deposition source 41, resulting in that, in the initial stage of heating the deposition source 41, the pressure in the first film-forming room 22 increases to be unstable owing to the impurities released from the deposition source. However, heating the deposition source 41 for a predetermined period of time or longer shall terminate the release of the impurities from the deposition source thus heated, resulting in that the pressure in the first film-forming room 22 decreases to be stabilized. Therefore, the pre-degassing of the room 22 is so effected that the reduced pressure, P1, in the thus-degassed room 22 satisfies the requirement noted above, $0.1p1 \leq P1 \leq 10p1$, after the termination of the release of the impurities to stabilize the pressure in the room 22, or that is, after the predetermined period of time from the start of the heating of the deposition source 41.

Where the plasma cleaning is completed within a short period of time, the pre-degassing of the first film-forming room 22 and the pre-heating of the deposition source 41 is started prior to starting the plasma cleaning so that the deposition rate, R1, to form the hole injection layer 13 on the substrate 17 and the pressure, P1, in the room 22 both may fall within the defined ranges before the finish of the plasma cleaning.

After the finish of the plasma cleaning of the electrode-mounted substrate 17, the valve 26 between the cleaning room 21 and the first film-forming room 22 is opened, through which the substrate 17 is transported into the room 22, and then the valve 26 is shut. Next, after the deposition rate, R1, to form the intended film on the substrate 17 and the pressure, P1, in the room 22 are stabilized to fall within the ranges defined relative to the predetermined deposition rate, r1, and the predetermined pressure, p1, noted above, the shutter 45 is opened to start the vaporization and deposition to form the hole injection layer 13.

In this embodiment, the deposition rate, R1, to form the intended film on the substrate 17 and the pressure, P1, in the first film-forming room 22 are controlled to fall within the defined ranges, $0.7r1 \leq R1 \leq 1.3r1$ with $R1 \geq 10$ Å/sec, and $0.1p1 \leq P1 \leq 10p1$, respectively, prior to finishing the plasma cleaning, thereby resulting in that the deposition rate, R1, to form the intended film on the substrate 17 and the pressure, P1, in the first film-forming room 22 reach the predetermined deposition rate, r1, and the predetermined pressure, p1, and are stabilized, within a shortest period of time immediately after the finish of the plasma cleaning. In other words, in this condition, the time from the finish of the plasma cleaning to the start of the vapor deposition to form the hole injection layer 13 shall be a shortest one, or concretely, shall be not longer than the previously-calculated time, T1, within which the contact angle with water of the surface of the transparent electrode 12 may increase to be larger by 10° than that thereof just after cleaned.

On the other hand, while the hole injection layer 13 is being formed, or that is, before the formation of the layer 13 through vapor deposition is finished, heating the deposition source 42 in the second film-forming room 23 and degassing the room 23 is started.

The pre-heating of the deposition source 42 is effected in the same manner as that for the pre-heating of the deposition source 41 in the first film-forming room 22 noted above, with the shutter 45 being shut and on the basis of a predetermined deposition rate, r2, to form the light-emitting layer 14 on the hole injection layer 13 previously formed on the substrate 17. Concretely, before the finish of forming the hole injection layer 13 through vapor deposition, the deposition source 42 is so-preheated that the deposition rate, R2, to form the layer 14 on the substrate 17 satisfies the requirements, $0.7r2 \leq R2 \leq 1.3r2$ and $R2 \geq 10$ Å/sec.

Pre-degassing the second film-forming room 23 is effected in the same manner as that for pre-degassing the first film-forming room 22 noted above, or that is, on the basis of a predetermined pressure, p2, in the room 23 under which the light-emitting layer 14 is to be formed therein. Concretely, before the finish of forming the hole injection layer 13 through vapor deposition in the room 22, the second film-forming room 23 is so degassed that the reduced pressure, P2, in the thus-degassed room 23 satisfies the requirements, $0.1p2 \leq P2 \leq 10p2$, and $1.33 \times 10^{-1}$ Pa $\leq P2 \leq 1.33 \times 10^{-5}$ Pa.

Where the formation of the hole injection layer 13 is completed within a short period of time, the pre-degassing of the second film-forming room 23 and the pre-heating of the deposition source 42 is started prior to starting the vapor deposition to form the layer 13 so that the deposition rate, R2, and the pressure, P2, in the room 23 both may fall within the defined ranges before the finish of the formation of the hole injection layer 13.

After the formation of the hole injection layer 13, the valve 27 between the first film-forming room 22 and the second film-forming room 23 is opened, through which the substrate 17 on which the films have been formed is transported into the room 23, and then the valve 27 is shut. Next, after the deposition rate, R2, to form the intended film on the substrate 17 and the pressure, P2, in the room 23 are stabilized to fall within the ranges defined relative to the predetermined deposition rate, r2, and the predetermined pressure, p2, noted above, the shutter 45 is opened to start the vaporization and deposition to form the light-emitting layer 14.

In this embodiment, the deposition rate, R2, to form the intended film on the substrate 17 and the pressure, P2, in the first film-forming room 23 are controlled to fall within the defined ranges noted above, prior to finishing the formation of the hole injection layer 13, thereby resulting in that the time from the finish of the formation of the hole injection layer 13 to the start of the vapor deposition to form the light-emitting layer 14 shall be not longer than the previously-calculated time, T2, within which the contact angle with water of the surface of the hole injection layer 13 may increase to be larger by 10° than that thereof just after formed.

Next, in the same manner as in the formation of these hole injection layer 13 and light-emitting layer 14, the deposition source 43 is preheated and the third film-forming room 24 is pre-degassed, and then the electron injection layer 15 is formed through vapor deposition; and thereafter the deposition source 44 is preheated and the fourth film-forming room 25 is pre-degassed, and then the counter electrode 16 is formed through vapor deposition. In these steps, the time from the finish of the formation of the light-emitting layer 14 to the start of the vapor deposition to form the electron injection layer 15 shall be not longer than the previously-calculated time, T3, within which the contact angle with water of the surface of the light-emitting layer 14 may increase to be larger by 10° than that thereof just after formed; and the time from the finish of the formation of the electron injection layer 15 to the start of the vapor deposition to form counter electrode 16 shall be not longer than the previously-calculated time, T4, within which the contact angle with water of the surface of the electron injection layer 15 may increase to be larger by 10° than that thereof just after formed.

After the formation of the counter electrode 16 in the fourth film-forming room 25 has been finished, the valve 37 is opened, then the substrate 17, on which all the intended films have been formed, is transported into the previously-degassed load locking room 36, then the valve 37 is shut, and finally the thus-processed substrate 17 is taken out after the pressure in the load locking room is restored to ordinary pressure.

The advantages of the embodiment illustrated hereinabove are mentioned below.

Forming the hole injection layer 13 through vapor deposition immediately after the electrode-mounted substrate 17 has been cleaned, or that is, before the contact angle with water of the surface of the transparent electrode 12 increases to be larger by 10° than that of the clean surface of the electrode 12, surely protects the layer 13 from being contaminated with impurities. In this connection, ultrasonically cleaning the electrode-mounted substrate 17 followed by cleaning it with plasma reduces the contact angle with water of the surface of the transparent electrode 12 to be smaller by 30° or more than that thereof before cleaned. In this embodiment, since the hole injection layer 13 is formed before the contact angle with water of the surface of the transparent electrode 12 increases to be larger by 10° or more than that thereof just after cleaned, or that is, since the layer 13 is formed on the surface of the transparent electrode 12 which is cleaner than the non-cleaned one, the interface between the transparent electrode 12 and the hole injection layer 13 formed thereon is surely prevented from being contaminated. Accordingly, in this embodiment, penetration of impurities into the organic EL device 1 produced is surely reduced, and the device 1 produced shall stably have the intended capabilities.

The light-emitting layer 14 is formed on the previously-formed hole injection layer 13 while the layer 13 is clean just after having been formed and before the contact angle with water of the surface of the layer 13 increases by 10°, whereby the penetration of impurities into the interface between the layer 13 and the layer 14 is prevented. In the same manner, the formation of the next electron injection layer 15 is started just after the formation of the light-emitting layer 14 and before the contact angle with water of the surface of the layer 14 increases by 10°, and the formation of the counter electrode 16 is started just after the formation of the previous electron injection layer 15 and before the contact angle with water of the surface of the layer 15 increases by 10°. As a result, the penetration of impurities into the interfaces of layer 14/layer 15/electrode 16 is prevented. Accordingly, the contamination of the interfaces of the film layers 13 to 16 is reduced, and the device 1 produced shall stably have the intended good capabilities.

In this embodiment, since the hole injection layer 13 to the counter electrode 16 are formed before the increase in the contact angle with water of the surfaces of the previous layers 12 to 15 is not larger than 10° just after the cleaning of the substrate 17 or after the formation of the previous layers 13 to 15, the impurities that may penetrate into the interfaces of those layers 12 to 16 are much reduced, resulting in that not only the uniformity of the light-emitting surface of the device 1 produced is improved but also the overall light-emitting capabilities thereof are improved. In this, therefore, the life of the device 1 produced is prolonged.

Since the deposition source 42 to form the light-emitting layer 14 is pre-heated prior to the finish of the formation of the previous hole injection layer 13, and since the deposition source 43 for the electron injection layer 15 and the deposition source 44 for the counter electrode 16 are also pre-heated prior to the finish of the formation of the previous light-emitting layer 14 and electron injection layer 15, respectively, the impurities that vaporize in the initial stage of heating those deposition sources 42 to 44 are removed during the formation of the previous layers 13, 14 and 15. Also since the heating of the deposition source 41 for the hole injection layer 13 is started prior to the finish of the plasma cleaning of the electrode-mounted substrate 17, the impurities that vaporize in the initial stage of heating the deposition source 41 are removed during the plasma cleaning of the substrate 17.

Accordingly, the layers 13 to 16 are prevented from being contaminated with the impurities that may be formed in the initial stage of heating the deposition sources 41 to 44, and the device 1 produced surely have good capabilities.

Since the deposition source 41 is pre-heated, the vaporizing condition of the deposition source 41 for the hole injection layer 13 is stabilized within a short period of time after the finish of cleaning the substrate 17. Therefore, forming the hole injection layer 13 is surely started before the contact angle with water of the surface of the electrode 12 previously mounted on the substrate 17 increases in vacuum to be larger by 10° than the initial value thereof just after cleaned.

Similarly, since the deposition sources 42 to 44 are all pre-heated, the vaporizing condition of the deposition source 42 for the light-emitting layer 14, that of the deposition source 43 for the electron injection layer 15 and that of the deposition source 44 for the counter electrode 16 are all stabilized within a short period of time after the finish of forming the previous hole injection layer 13, light-emitting layer 14 and electron injection layer 15, respectively. Therefore, forming the next light-emitting layer 14, electron injection layer 15 and counter electrode 16 that are formed one after another in that order is surely started before the contact angle with water of the surfaces of the previous hole injection layer 13, light-emitting layer 14 and electron injection layer 15, respectively, increases to be larger by 10° than the initial values thereof just after formed.

Accordingly, the contamination of the surfaces of those layers 12 to 15, or that is, the contamination of the interfaces of the layers 12 to 16 is surely reduced, and the device 1 produced shall stably have the intended capabilities.

Since the pre-heating of the deposition source 41 for the hole injection layer 13 is so attained, before the finish of the plasma cleaning of the substrate 17 in the cleaning room 21, that the deposition rate, R1, to form the layer 13 on the substrate 17 satisfies the requirements, $0.7r1 \leq R1 \leq 1.3r1$ and $R1 \geq 10$ Å/sec, the deposition rate, R1, is stabilized to reach the predetermined deposition rate, r, within a shortest period of time.

In addition, since the vaporization sources 42 to 44 for the light-emitting layer 14, the electron injection layer 15 and the counter electrode 16 are pre-heated under the same condition as above, the deposition rates for those layers 14 to 16 (for example, R2 for the light-emitting layer 14) are all stabilized to reach the predetermined deposition rates for them (for example, r2 for the light-emitting layer 14) within a shortest period of time.

Accordingly, immediately after the finish of cleaning the substrate 17 with plasma or after the finish of deposition the previous layers 13 to 15, the deposition of the next layers 13 to 16 is started, and, as a result, the contamination of the interfaces of those layers 12 to 16 is greatly reduced, and in addition, the tactical time for continuous production of the device 1 is surely shortened.

Since the first film-forming room 22 is pre-degassed before the plasma cleaning is finished, the pressure P1 in the room 22 is reduced to the predetermined pressure p1 within a short period of time after the finish of the plasma cleaning, thereby ensuring the start of forming the hole injection layer 13 before the contact angle with water of the surface of the electrode 12 mounted on the substrate 17 increases in vacuum to be larger by 10° than the initial value thereof just after cleaned.

Similarly, since the second film-forming room 23, the third film-forming room 24 and the fourth film-forming room 25 are all pre-degassed prior to the finish of the formation of the previous hole injection layer 13, light-emitting layer 14 and electron injection layer 15, respectively, the pressure, P2, in the room 23, the pressure in the room 24 and the pressure in the room 25 are all stabilized within a short period of time after the finish of forming those layers 13, 14 and 15. Therefore, forming the next light-emitting layer 14, electron injection layer 15 and counter electrode 16 that are formed one after another in that order is surely started before the contact angle with water of the surfaces of the previous hole injection layer 13, light-emitting layer 14 and electron injection layer 15, respectively, increases to be larger by 10° than the initial values thereof just after formed.

As a result, the contamination of the surfaces of those layers 12 to 15, or that is, the contamination of the interfaces of the layers 12 to 16 is surely reduced, and the device 1 produced shall stably have the intended capabilities.

Since the first film-forming room 22 is so pre-degassed that the pressure, P1, in the room 22 is to satisfy the requirement, $0.1p1 \leq P1 \leq 10p1$ before the plasma cleaning is finished in the cleaning room 21, the pressure, P1, in the room 22 in which the hole injection layer 13 is being formed is stabilized to reach the predetermined pressure, p1, within a shortest period of time.

In addition, since the second to fourth film-forming rooms 23 to 25 are also pre-degassed in the same manner as in the room 22, the pressure in those rooms 23 to 25 (for example, P1 in the room 23) in which the light-emitting layer 14, the electron injection layer 15 and the counter electrode 16 are being formed, is stabilized to reach the predetermined pressure (for example, p1 in the room 23) within a shortest period of time.

Accordingly, the deposition of the layers 13 to 16 is started immediately after the plasma cleaning and immediately after the finish of deposition the previous layers 13 to 15, and, as a result, the contamination of the interfaces of the layers 12 to 16 is greatly reduced, and the tactical time for continuous production of the device 1 is surely shortened.

The invention is not limited to only the embodiment illustrated hereinabove, but encompasses any other constitutions and modifications attaining the objects of the invention, such as those mentioned below.

In the illustrated embodiment, the layers 13 to 16 are formed in different film-forming rooms 22 to 25. In the invention, however, those plural layers may also be formed in one and the same vacuum chamber. In this case, preferably, each deposition source is pre-heated.

Alternatively, one and the same compound may be evaporated from a plurality of deposition sources to form plural layers in one and the same vacuum chamber. For doping, different compounds may be evaporated all at the same time from different deposition sources to form plural layers in one and the same vacuum chamber.

In the illustrated embodiment, the electrode-mounted substrate is cleaned with plasma. However, in the invention, the method of cleaning the substrate is not specifically defined. For example, the substrate maybe cleaned with ultraviolet rays, ion beams, etc.

The organic EL devices to be produced in the invention are not limited to only the illustrated one. Needless-to-say, the invention shall apply to any other organic EL devices having different structures.

As has been described in detail hereinabove with reference to some preferred embodiments, in the method of the present invention, the first layer is formed on the surface of the electrode as mounted on a substrate immediately after the electrode-mounted substrate is cleaned and before the contact angle with water of the surface of the electrode increases by 30°. Therefore, penetration of impurities into the interface between the electrode and the first layer is surely prevented, and the devices produced stably have the intended capabilities.

In addition, in the method of the invention for producing organic EL devices having a plurality, n=1, 2, 3, . . . , of film layers, the (n+1)'th layer is formed immediately after the formation of the previous n'th layer and before the contact angle with water of the surface of the n'th layer increases by 30°. Therefore, penetration of impurities into the interface between the n'th layer and the (n+1)'th layer is surely prevented, and the devices produced stably have the intended capabilities.

While the invention has been described in detail and with reference to specific embodiments thereof, it will be apparent to one skilled in the art that various changes and modifications can be made therein without departing from the spirit and scope thereof.

What is claimed is:

1. A method for producing organic electroluminescent devices, comprising cleaning an electrode-mounted substrate followed by forming a plurality of film layers including organic layers and a counter electrode layer, on the electrode mounted on the substrate, successively one after another through vapor deposition in vacuum, wherein, a time just after a finish of cleaning the electrode-mounted substrate and before a start of forming a first film layer on the electrode is shorter than the time within which a contact angle with water of a surface of the electrode just after the finish of cleaning it increases by 30° in vacuum.

2. A method for producing organic electroluminescent devices, comprising forming a plurality of film layers including organic layers and a counter electrode layer, on an electrode mounted on a substrate, successively one after another through vapor deposition in vacuum, wherein, the time just after the finish of forming a starting film layer and before the start of forming a next film layer is shorter than the time within which the contact angle with water of the surface of the starting film layer just after having been formed increases by 30° in vacuum.

3. The method for producing organic electroluminescent devices as claimed in claim 2, wherein the deposition source for a next film layer is previously heated before a formation of the starting film layer is finished.

4. The method for producing organic electroluminescent devices as claimed in claim 3, wherein a pre-heating of the deposition source for the next film layer is so attained, before the finish of the formation of the previous starting layer, that a deposition rate, R, of a vaporizing material to give the next film layer on the substrate satisfies, while being based on a predetermined deposition rate, r, to form the next film layer on the substrate, the requirements of $0.7r \leq R \leq 1.3 r$ and $R \geq 10$ Å/sec.

5. The method for producing organic electroluminescent devices as claimed in any one of claims 2 to 4, wherein the plurality of film layers are formed in different vacuum chambers and a vacuum chamber in which the next film layer is to be formed is previously degassed before the formation of a starting layer is finished.

6. The method for producing organic electroluminescent devices as claimed in claim 5, wherein a pre-degassing of the vacuum chamber for the next film layer is so attained, before the finish of a formation of a previous starting film layer, that a pressure, P, in the vacuum chamber for the next film layer satisfies, while being based on a predetermined pressure, p, in the vacuum chamber in which the next film layer is to be formed, the requirement of $0.1p \leq P \leq 10p$.

* * * * *